United States Patent
Tazima et al.

(10) Patent No.: US 7,446,342 B2
(45) Date of Patent: Nov. 4, 2008

(54) LIGHT EMITTING DIODE HAVING CONDUCTIVE REFLECTING LAYER

(75) Inventors: Mikio Tazima, Suginami-ku (JP); Tetsuji Moku, Asaka (JP); Junji Sato, Saitama (JP); Yasuhiro Kamii, Fujimino (JP); Arei Niwa, Fujimino (JP)

(73) Assignee: Sanken Electric Co., Ltd., Saitama-ken (JP)

( * ) Notice: Subject to any disclaimer, the term of this patent is extended or adjusted under 35 U.S.C. 154(b) by 172 days.

(21) Appl. No.: 11/350,332

(22) Filed: Feb. 8, 2006

(65) Prior Publication Data

US 2006/0193355 A1 Aug. 31, 2006

(30) Foreign Application Priority Data

Feb. 28, 2005 (JP) ............................. 2005-052934

(51) Int. Cl.
H01L 27/15 (2006.01)
(52) U.S. Cl. ............................. 257/79; 438/22; 438/29
(58) Field of Classification Search .................. 257/79; 250/552; 313/498; 340/760; 362/84; 372/31; 438/22, 29
See application file for complete search history.

(56) References Cited

U.S. PATENT DOCUMENTS 5,406,095 A * 4/1995 Koyama et al. ............... 257/88

2003/0048822 A1 * 3/2003 Nakatsu et al. ............... 372/43

FOREIGN PATENT DOCUMENTS

JP 2003163368 6/2003

OTHER PUBLICATIONS

Contant resistance (1992). In Academic Press dictionary of Science and Technology. Retrieved Dec. 10, 2007, from http://www.credoreference.com/entry/0389573.*

* cited by examiner

Primary Examiner—Jerome Jackson
Assistant Examiner—Jami M Valentine
(74) Attorney, Agent, or Firm—Wood, Herron & Evans, L.L.P.

(57) ABSTRACT

There is provided a semiconductor light emitting diode and a method of manufacturing the same that enable voltage in the forward direction to be decreased while allowing light extraction efficiency to be improved. This semiconductor light emitting diode is formed by a substrate, a light emitting portion that is disposed on one main surface of the substrate, a first electrode that is disposed on the light emitting portion, a pad electrode that is disposed on the first electrode, concave portions that are formed on at least a portion of the one main surface of the substrate, and a conductive layer that is formed from a conductive material that is disposed in the concave portions and reflects light emitted from the light emitting portion.

7 Claims, 5 Drawing Sheets

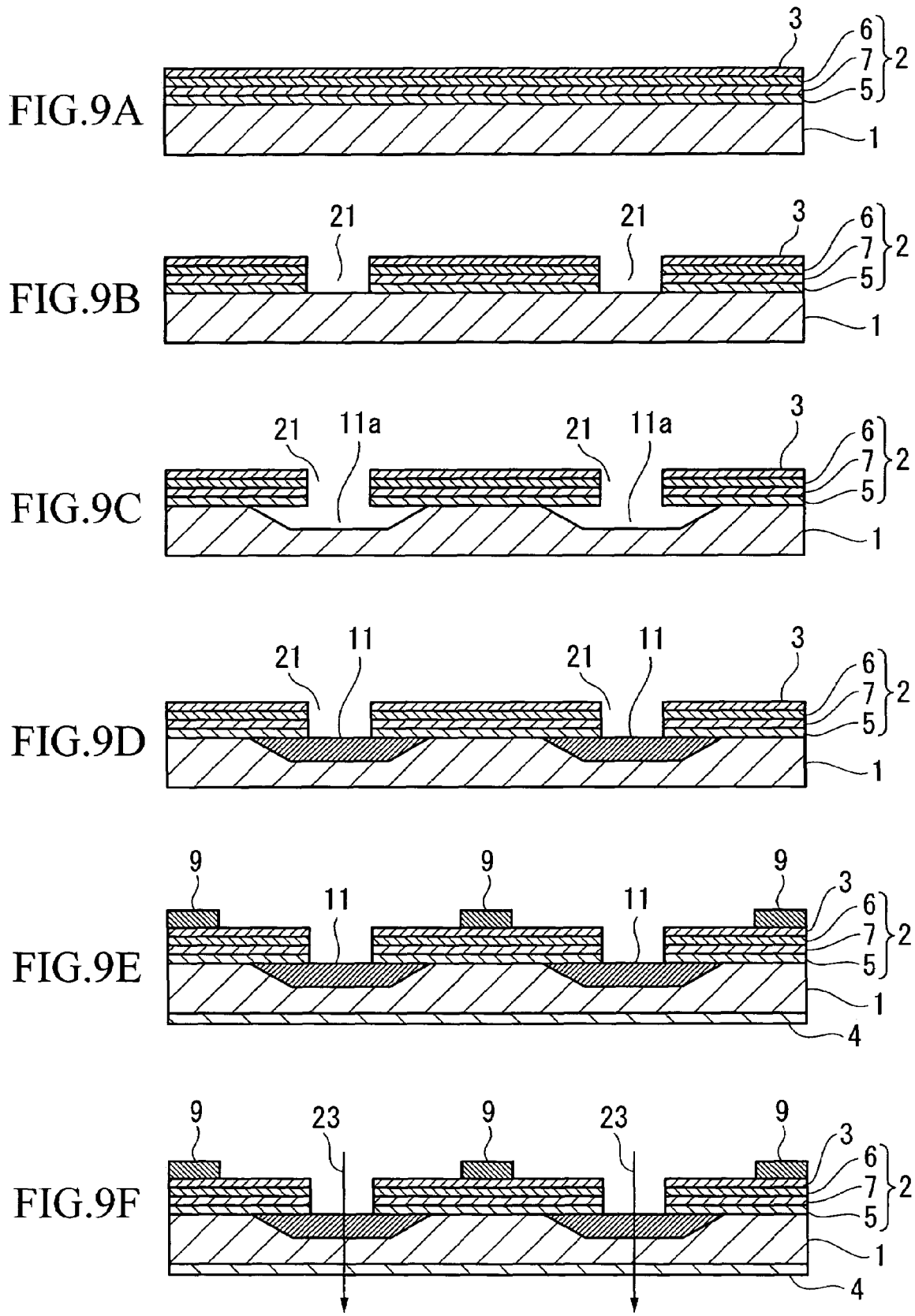

LIGHT EMITTING DIODE HAVING CONDUCTIVE REFLECTING LAYER

BACKGROUND OF THE INVENTION

1. Field of the Invention

The present invention relates to a semiconductor light emitting diode and to a method of manufacturing the same.

Priority is claimed on Japanese Patent Application No. 2005-052934, filed Feb. 28, 2005, the contents of which are incorporated herein by reference.

2. Description of Related Art

Semiconductor light emitting diodes that have nitride based compound semiconductors are formed by arranging light emitting portions on a substrate of silicon, ceramic, SiC, or the like. The various types of structure described below may be used for the light emitting portions. Firstly, there is a double hetero structure in which a light emitting layer is sandwiched between a first conductive type of semiconductor layer and a second conductive type of semiconductor layer. Secondly, there is a single quantum well structure (SQW) in which an extremely thin light emitting laser is sandwiched between two semiconductor layers. Thirdly, there is a multiple quantum well structure (MQW) in which the light emitting layer is formed by multiple thin layers. Moreover, in a conventional semiconductor light emitting diode, a first electrode is disposed on the light emitting portion, while, in a conventional semiconductor light emitting diode, a second electrode is disposed on a bottom surface side of a substrate (i.e., on the surface on the opposite side from the light emitting portion side). The second electrode may be connected electrically to the first electrode via the light emitting portion.

In addition, in order to be able to fulfill its role of supporting the light emitting portion, the substrate is formed with a degree of thickness. Therefore, in order to efficiently extract light that is emitted from a light emitting layer, a structure may be considered in which a reflective membrane is provided between the light emitting layer and the substrate. If this type of structure is employed, the light that is emitted from the light emitting layer in the direction of the substrate is reflected by the reflective membrane and discharged to the outside from the first electrode side. Furthermore, a structure may be considered in which the reflectance is improved by superimposing reflective membranes that each have a different refractive index (see Patent Document 1: Japanese Unexamined Patent Application, First Publication No. 2003-163368). The reflective membrane described in Patent Document 1 is a multilayer structure formed by a primary reflective membrane that is formed from $AlO_y$, which is a non-conductive material, and a secondary reflective membrane that is formed from AlGaAs that has lower refractive index that that of the primary reflective membrane.

Furthermore, if consideration is given to problems such as the light that is emitted from the light emitting layer by the first electrode becoming attenuated when it is emitted to the outside of the semiconductor device, then if the first electrode is formed not over the entire top surface of the semiconductor layer (i.e., the light emitting portion), but only on a portion thereof, the distance of the current path in each portion between the first electrode and the second electrode is not uniform. Namely, the current path between the first electrode and positions on the second electrode that are directly below the first electrode is shorter than the current path between the first electrode and positions on the second electrode that are not directly below the first electrode. In addition, because a resistance value between the first electrode and second electrode is proportionate to the distance of the current path between the two, current flows in comparatively larger quantity on the current path between the first electrode and the positions on the second electrode that are directly below the first electrode. As a result of this, when current diffusion in a horizontal direction is low, light is emitted only from the vicinity of the light emitting layer directly below the first electrode.

In contrast to this, a structure may be considered in which, by forming the first electrode substantially over the entire top surface of the semiconductor layer (i.e., the light emitting portion), the current can be made to spread to the entire semiconductor light emitting diode, so that the efficiency of the extraction of light from the light emitting layer is improved. Moreover, a structure may also be considered in which the first electrode is formed from a thin electrode material that is optically transparent such that light is not obstructed in the first electrode. Furthermore, a structure may also be considered in which current is made to flow in an entire semiconductor light emitting diode by providing a current blocking layer that is wider than a pad electrode directly below the pad electrode so that the resistance value of the current path directly below the pad electrode is raised.

However, in the conventional semiconductor light emitting diode described in Patent Document 1, because the reflective membrane that is formed from a non-conductive $AlO_y$ material is formed around a conductive layer, current is not able to pass through the reflective membrane and must pass through the conductive layer on the inner side of the reflective membrane, resulting in the current path being made smaller. As a result of this, there is a rise in the voltage in the forward direction of the semiconductor light emitting diode.

Furthermore, in the semiconductor light emitting diode described in Patent Document 1, a current obstructing layer is provided directly below the pad electrode that is provided in the center. In a semiconductor light emitting diode that has this type of structure, the current path between the first electrode and the second electrode is lengthened, and the problem rises that there is a rise in the voltage in the forward direction.

Furthermore, in structure of the semiconductor light emitting diode described in Patent Document 1, if a light emitting portion is formed on the reflective membrane, crystal defects tend to occur that are caused by a difference between the size of the lattice of the crystals forming the reflective membrane and the size of the lattice of the crystals forming the light emitting portion.

In contrast to this, a manufacturing method may be considered in which a portion made up of a reflective membrane and a substrate and a portion made up of a light emitting portion are formed in advance, and the two portions are then adhered together. However, in this manufacturing method, problems relating to the adhesion between the two in bond portions and problems relating to the increased complexity of the manufacturing process arise.

SUMMARY OF THE INVENTION

The present invention was conceived in order to solve the above described problems, and it is an object thereof to provide a semiconductor light emitting diode and a manufacturing method for the same that can reduce the voltage in the forward direction.

Moreover, it is an object of the present invention to provide a semiconductor light emitting diode that can reduce the voltage in the forward direction while enabling the light extraction efficiency to be improved.

Moreover, it is an object of the present invention to provide a semiconductor light emitting diode and a manufacturing method for the same that can reduce the voltage in the forward direction while enabling the light extraction efficiency to be improved, and that can be manufactured even more easily.

In order to solve the above described problems, the semiconductor light emitting diode according to the first aspect of the present invention that is designed to achieve the above described objects includes: a substrate; a light emitting portion that is disposed on one main surface of the substrate; and a first electrode that is disposed on the light emitting portion. In addition, when viewed from above the one main surface, the substrate extends beyond the light emitting portion. Moreover, a conductive layer that is formed from a conductive material is formed on the substrate side of the one main surface and, when viewed from above the one main surface, is formed extending from an inner side of the light emitting portion towards an area where the substrate extends beyond the light emitting portion. In addition, this conductive layer has a function of reflecting light emitted from the light emitting portion.

Furthermore, the second aspect of the present invention is the semiconductor light emitting diode according to first aspect in which the conductive layer has a function of connecting the substrate to the light emitting portion, and a sum of a contact resistance between the conductive layer and the substrate and a contact resistance between the conductive layer and the light emitting portion is less than a contact resistance between the light emitting portion and the substrate.

Furthermore, the third aspect of the present invention is the semiconductor light emitting diode according to the first or second aspect in which, when viewed from above the one main surface, the conductive layer is not formed directly beneath a pad electrode.

Furthermore, the fourth aspect of the present invention is the semiconductor light emitting diode according to any one of the first through third aspects in which, when viewed from above the one main surface, the conductive layer is formed extending from an inner side of the light emitting portion towards an area where the substrate extends beyond the light emitting portion, and the conductive layer protrudes and is exposed as far as an outer side of the light emitting portion.

Furthermore, the fifth aspect of the present invention is the semiconductor light emitting diode according to any one of the first through fourth aspects in which a reflective membrane that is formed from a material having a different refractive index from the refractive index of the conductive layer is disposed on an inner side of the conductive layer.

Furthermore, the sixth aspect of the present invention is a method of manufacturing a semiconductor light emitting diode that includes: a step in which a light emitting portion is formed on one main surface of a substrate; a step in which, when viewed from above the one main surface, a portion of the light emitting portion is removed as far as the substrate, so as to expose a portion of a surface of the substrate; a step in which, when viewed from above the one main surface, a concave portion is formed in the one main surface of the substrate so as to extend from the exposed area of the substrate in a direction towards a boundary face between the substrate and the light emitting portion; and a step in which a conductive material having a reflective function is embedded in the concave portion.

The invention according to the above described aspects has the following effects.

According to the first aspect of the present invention, it is possible to improve the light extraction efficiency. Namely, as a result of light that is emitted from the light emitting portion being reflected by the conductive layer that is formed extending from the inner side of the light emitting portion towards the area where the substrate extends beyond the light emitting portion, it is possible to reduce the proportion of the light emitted from the light emitting portion that is absorbed by the substrate. Furthermore, in the conductive layer, it is possible to reflect light in the direction of the light extracting surface (i.e., above the one main surface of the substrate), and it is thus possible to improve the light extraction efficiency at the light extraction surface. Furthermore, because a structure is employed in which light is reflected by a conductive layer that has conductivity, it is possible to reflect light emitted from the light emitting portion using the conductive layer without reducing the size of the current path. As a result of the above described circumstances, it is possible to keep the voltage in the forward direction at a low level while improving the light extraction efficiency of the semiconductor light emitting diode.

Furthermore, according to the second aspect of the present invention, in addition to the effects of the first aspect, by making the sum of the contact resistance between the conductive layer and the substrate and the contact resistance between the conductive layer and the light emitting portion less than the contact resistance between the light emitting portion and the substrate, it is possible to decrease the resistance value of the current path flowing through the conductive layer that is formed so as to extend from the inner side of the light emitting portion towards the area where the substrate extends beyond the light emitting portion. As a result, it is possible to diffuse current over the entire surface of the semiconductor light emitting diode. In other words, because it is possible to extract the light that is emitted from the light emitting portion to the outside of the semiconductor light emitting diode without this light being obstructed by the first electrode, it is possible to keep the voltage in the forward direction at a low level while improving further the light extraction efficiency of the semiconductor light emitting diode.

Furthermore, according to the third aspect of the present invention, the conductive layer is not provided directly beneath the pad electrode (i.e., at a position in a direction under the pad). In other words, on the one main surface of the substrate, the area directly beneath the pad electrode is in contact with the light emitting portion and the substrate, and the conductive layer is formed so as to surround the boundary face between the light emitting portion and the substrate. As a result, it is possible to achieve the same effect as a structure in which a high resistance layer (i.e., a current blocking layer) is disposed directly below the pad electrode, current concentration directly below the pad electrode can be lessened, any obstruction by the first electrode of the light that is emitted from the light emitting portion can be improved, and the light extraction efficiency can be improved. As a result of the above described circumstances, it is possible to keep the voltage in the forward direction at a low level while further improving the light extraction efficiency of the semiconductor light emitting diode.

Furthermore, according to the fourth aspect of the present invention, when viewed from above the one main surface of the substrate, the conductive layer is formed extending from the inner side of the light emitting portion towards the area where the substrate extends beyond the light emitting portion, and the conductive layer protrudes and is exposed as far as the outer side of the light emitting portion. Consequently, the resistance value of locations where the conductive layer is provided can be reduced, and current concentration directly below the pad electrode can be lessened. As a result, any obstruction by the first electrode of the light that is emitted from the light emitting portion can be improved, and the light extraction efficiency can be improved. Moreover, it is also possible for light that is emitted to the outside from the light emitting portion (i.e., in a diagonally downward direction when viewed in cross section, see FIG. 1) to be reflected by the conductive portion that protrudes and is exposed as far as the outer side of the light emitting portion. As a result of the above described circumstances, it is possible to keep the voltage in the forward direction at a low level while further improving the light extraction efficiency of the semiconductor light emitting diode.

According to the fifth aspect of the present invention, it is possible for light to be reflected not only by the surface of the conductive layer, but also by boundary faces between the conductive layer and the reflective membrane that is provided inside the conductive layer. It is thus possible to improve the refractive index throughout the whole conductive layer while improving the light extraction efficiency of the semiconductor light emitting diode.

According to the sixth aspect of the present invention, because the conductive layer is embedded after the light emitting portion has been formed on the substrate, compared with a conventional manufacturing method in which a portion that is made up of the conductive layer and the substrate is adhered to a portion that is made up of the light emitting portion, the adhering step is removed and the manufacturing is simplified. Moreover, if the light emitting portion is stacked on top of the conductive layer, it is difficult for crystal growth to occur on the light emitting portion formed on the conductive layer, and it is easy for crystal defects to occur on the light emitting portion. However, by applying the sixth aspect of the present invention, this problem can be solved. In addition, it is not necessary to select a material that provides excellent adhesion between the conductive layer and the substrate and light emitting portion. Accordingly, the selection of a conductive material having excellent conductivity and reflectivity can be simplified, and it is possible to provide a semiconductor light emitting diode that has comparatively high light extraction efficiency, and that has a comparatively low level of voltage in the forward direction.

BRIEF DESCRIPTION OF THE DRAWINGS

FIG. 9A is a cross-sectional view showing a method of manufacturing a semiconductor light emitting diode according to an embodiment of the present invention.

FIG. 9B is a cross-sectional view showing a method of manufacturing a semiconductor light emitting diode according to an embodiment of the present invention.

FIG. 9C is a cross-sectional view showing a method of manufacturing a semiconductor light emitting diode according to an embodiment of the present invention.

FIG. 9D is a cross-sectional view showing a method of manufacturing a semiconductor light emitting diode according to an embodiment of the present invention.

FIG. 9E is a cross-sectional view showing a method of manufacturing a semiconductor light emitting diode according to an embodiment of the present invention.

FIG. 9F is a cross-sectional view showing a method of manufacturing a semiconductor light emitting diode according to an embodiment of the present invention.

DETAILED DESCRIPTION OF THE INVENTION

Next, a description will be given with reference made to the drawings of a semiconductor light emitting diode that has a nitride based compound semiconductor as a semiconductor light emitting diode according to an embodiment of the present invention.

First Embodiment

Figure 1:
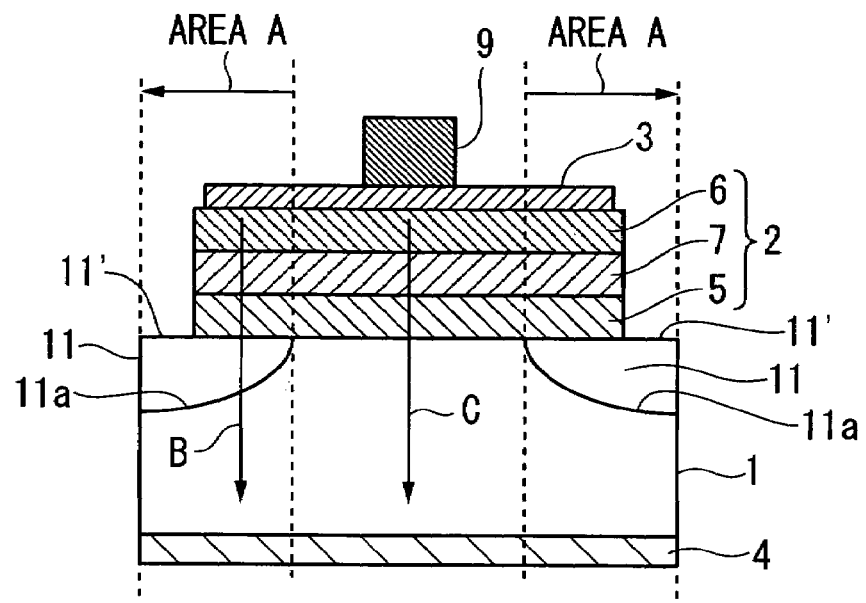
FIG. 1 is a cross-sectional view showing a semiconductor light emitting diode according to a first embodiment of the present invention.

FIG. 1 is a cross-sectional view showing a semiconductor light emitting diode according to a first embodiment of the present invention. The semiconductor light emitting diode of the first embodiment is formed by a substrate 1, a light emitting portion 2, a first electrode 3, a second electrode 4, a pad electrode 9, and a conductive layer 11.

The substrate 1 is formed from a material that has conductivity such as silicon or SiC. The light emitting portion 2 is formed on the top of substrate 1 (i.e., on one of the main surfaces thereof). For example, the substrate 1 may be formed from a low-resistance n-type silicon. Namely, the substrate 1 may be formed from an n+ type silicon monocrystal that includes As (i.e., arsenic) as an n-type conductivity determining impurity.

The light emitting portion 2 that is formed from a semiconductor layer that includes a light emitting functional layer is formed on one main surface of the substrate 1, and, when viewed from above this main surface, the light emitting portion 2 is formed having an area that enables the substrate 1 to extend beyond the light emitting portion 2. In other words, when viewed from above the main surface, an area where there is no light emitting portion 2 exists on the one main surface of the substrate 1. As is shown in FIG. 1, a first structural example of the light emitting portion 2 is a double hetero structure in which a light emitting layer 7 is sandwiched between a first cladding layer 5 that is formed by a first conductive type of nitride based compound semiconductor and a second cladding layer 6 that is formed by a second conductive type of nitride based compound semiconductor. As is shown in FIG. 1, a second structural example of the light emitting portion 2 is a single quantum well structure (SQW) in which an extremely thin light emitting layer 7 is sandwiched between a first cladding layer 5 and a second cladding layer 6. As is shown in FIG. 1, a third structural example of the light emitting portion 2 is a multiple quantum well structure (MQW) that is formed by thin layers of multiple light emitting layers 7 that are disposed between a first cladding layer 5 and a second cladding layer 6. For example, the first cladding layer 5 may be formed from n-type gallium nitride (GaN), the light emitting layer 7 may be formed from p-type gallium indium nitride (InGaN), and the second cladding layer 6 may be formed from p-type gallium nitride (GaN).

The first electrode 3 is formed on the light emitting portion 2. The first electrode 3 constitutes an anode electrode of the semiconductor light emitting diode of the first embodiment of the present invention. In order to allow light emitted from the light emitting portion 2 to be transmitted, the first electrode 3 is formed very thinly and so as to be optically transparent. For example, the first electrode 3 may be formed by stacking layers of nickel (Ni) having a film thickness of 5 nm together with gold (Au) having a film thickness of 5 nm. The pad electrode 9 is formed on a surface of the first electrode 3. The pad electrode 9 is used to electrically connect the semiconductor light emitting diode of the first embodiment of the present invention to the outside, and is electrically connected by a wire bonding method or the like. It is also possible for the first electrode 3 to not be formed over the entire top surface of the light emitting portion 2, as is shown in FIG. 1, but to be formed in a portion of the area of the top surface of the light emitting portion 2. Moreover, in this case, the effects of the present invention can be obtained even if the pad electrode 9 is replaced by the first electrode 3.

The second electrode 4 is formed on the other main surface of the substrate 1 (i.e., on the bottom surface of the substrate 1). The second electrode 4 constitutes a cathode electrode of the semiconductor light emitting diode of the first embodiment of the present invention. The second electrode 4 may be formed, for example, from aluminum (Al). The second electrode 4 is formed such that current flows between itself and the first electrode 3 via the light emitting portion 2 without there being any short-circuiting to the first electrode 3.

The conductive layer 11 is positioned on a concave portion 11a that is formed in a ring shape (i.e., a doughnut shape) on the substrate 1 side of the one main surface, namely, in a portion of the area of the one main surface (i.e., the top surface) of the substrate 1. However, it is desirable that, when the one main surface is viewed from above, the concave portion 11a is disposed in an area that is not directly below the pad electrode 9. The conductive layer 11 is positioned so as to fill this concave portion 11a.

It is also desirable that, when viewed from above the one main surface of the substrate 1, the conductive layer 11 is formed in a ring shape (i.e., a doughnut shape) extending from the inner side of the light emitting portion 2 to an area where the substrate 1 extends beyond the light emitting portion 2. In other words, it is desirable that the conductive layer 11 is formed so as to protrude as far as the outer side of the light emitting portion 2. Furthermore, it is also desirable that the conductive layer 11 protrudes as far as the outer side of the light emitting portion 2 and is also exposed when viewed from above the one main surface. In other words, it is desirable that the conductive layer 11 that is positioned so as to include the inner side of the light emitting portion 2 adjacent to the outer circumference of the light emitting portion 2 and an exposed portion 11' of the conductive layer 11 that is positioned in a ring shape so as to encircle the outer circumference of the light emitting portion 2 are formed so as to be continuous with each other (the area where the conductive layer 11 is formed is hereinafter referred to as the area A). Note that, in FIG. 1, it is desirable that the conductive layer 11 extends as far as the edge of the substrate 1, however, it is not essential for it to extend as far as the edge of the substrate 1.

The conductive layer 11 reflects light that is emitted from the light emitting portion 2. The conductive layer 11 is formed from a conductive material that has low resistance (or a high concentration of impurities), and is electrically connected to both the first cladding layer 5 and the substrate 1. Namely, the conductive layer 11 is formed between the substrate 1 and the light emitting portion 2, and is electrically connected at low resistance to the substrate 1 and the light emitting portion 2.

Accordingly, it is the desirable that a sum total of the contact resistance at a boundary face between at least the conductive layer 11 and the substrate 1 and the contact resistance at a boundary face between the conductive layer 11 and the light emitting portion 2 is less than the contact resistance at a boundary face between the light emitting portion 2 and the substrate 1 so that the resistance value of a current path B that passes through the conductive layer 11 is lower than a resistance value of a current path C that does not pass through the conductive layer 11. By employing this type of structure, current passes easily through the conductive layer 11, and current flowing through the semiconductor light emitting diode is easily diffused in a horizontal direction in the drawings (i.e., in a direction orthogonal to the flow path). Accordingly, it is desirable that the conductive layer 11 and the substrate 1 are in ohmic contact. Furthermore, it is also desirable that the conductive layer 11 and the light emitting portion 2 are also in ohmic contact. It is additionally desirable that the material constituting the conductive layer 11 has a smaller sheet resistance than that of the substrate 1.

For example, if the vicinity of the boundary face between the light emitting portion 2 and the substrate 1 is formed by the same n-type semiconductor, then it is desirable that the constituent material of the conductive layer 11 has a small work function in order to lower the contact resistance at the boundary face of the conductive layer 11. It is accordingly desirable that the conductive layer 11 includes at least one of Ag, Al, and Au as a constituent element. Conversely, if the vicinity of the boundary face between the light emitting portion 2 and the substrate 1 is formed by the same p-type semiconductor, then it is desirable that the constituent material of the conductive layer 11 has a large work function, and it is desirable that the conductive layer 11 includes at least one of Rh, Ni, Pd, and Pt as a constituent element.

Figure 2:
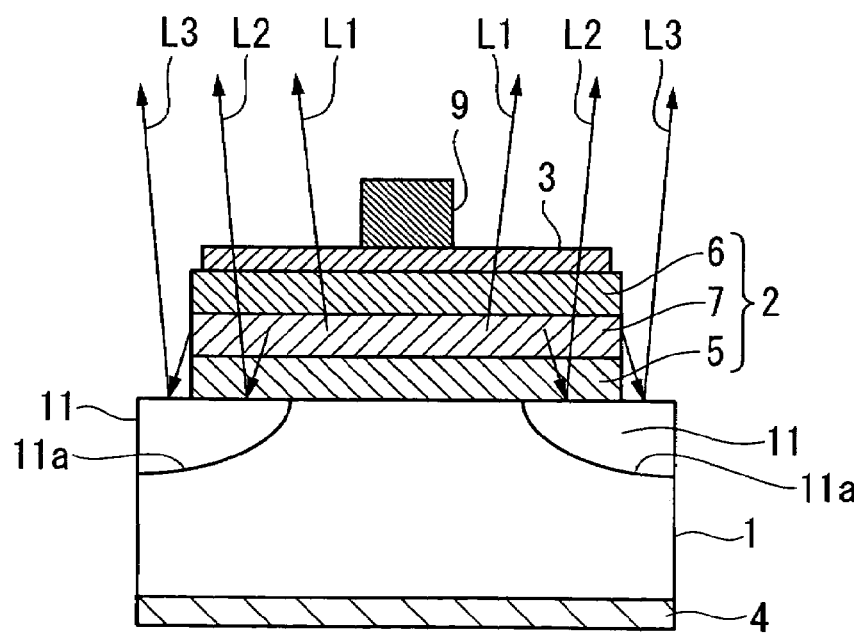
FIG. 2 is a cross-sectional view for illustrating the operation and effect of the semiconductor light emitting diode according to a first embodiment of the present invention.

FIG. 2 is a cross-sectional view for illustrating the operation and effect of the semiconductor light emitting diode according to the first embodiment of the present invention that is shown in FIG. 1. According to the semiconductor light emitting diode of the first embodiment of the present invention, it is possible for the light extraction efficiency to be improved. The light that is emitted from the light emitting portion 2 is not only light L1 that is emitted upwards (i.e., in the direction of the first electrode 3), as viewed from the light emitting portion 2, but also light that is emitted downwards (i.e., in the direction of the second electrode 4). A portion of this light that is emitted downward is reflected by the conductive layer 11 and becomes light L2 that is traveling upward. Light is also emitted from side surfaces of the light emitting portion 2. A portion of this light that is emitted from the side surfaces is also reflected by the conductive layer 11 and becomes light L3 that is traveling upward. As a result, it is possible to improve the light extraction efficiency at light extraction surfaces (i.e., upwards) in the semiconductor light emitting diode of the first embodiment of the present invention.

Moreover, according to the semiconductor light emitting diode of the first embodiment, because the conductive layer 11 also functions as a reflective membrane, it is possible to improve the light extraction efficiency by effectively reflecting emitted light in the direction of the light extraction surface while at the same time securely maintaining the current path.

Namely, it is possible to improve the light extraction efficiency while keeping the voltage in the forward direction at a low level.

Furthermore, according to the semiconductor light emitting diode of the first embodiment, the conductive layer 11 is not provided directly below the pad electrode 9, but is provided in the area A. As a result, it is possible to reduce the resistance value passing through the conductive layer 11, and it is possible to achieve the same effect as is achieved in a structure in which a high resistance layer (i.e., a current blocking layer) is provided directly below the pad electric 9. Namely, it is possible to reduce the concentration of current directly below the pad electrode 9, improve brightness unevenness, and achieve an extended lifespan.

Second Embodiment

Figure 3:
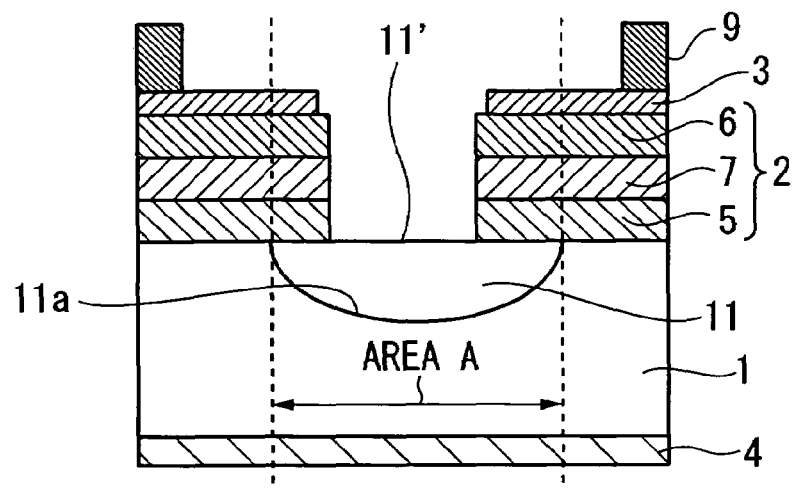
FIG. 3 is a cross-sectional view showing a semiconductor light emitting diode according to a second embodiment of the present invention.

FIG. 3 is a cross-sectional view showing a semiconductor light emitting diode according to a second embodiment of the present invention. In FIG. 3, component elements that are the same as component elements of the first embodiment shown in FIG. 1 are given the same symbols. The second embodiment mainly differs from the first embodiment in the disposition of the conductive layer 11 on a flat surface, and in the disposition configuration of the light emitting portion 2, the first electrode 3, and the pad electrode 9.

In the semiconductor light emitting diode according to the second embodiment of the present invention, it is desirable that the light emitting portion 2 is formed in a ring shape (i.e., a doughnut shape) such that the substrate 1 has an area that extends beyond the light emitting portion 2, and that the conductive layer 11 is positioned on a concave portion 11a that is formed on a top surface side of the substrate 1 extending towards an area (i.e., an exposed area 11') that extends from the inner side of the light emitting portion 2. Furthermore, it is desirable that the light emitting portion 2 is formed in a ring shape (i.e., a doughnut shape) that includes the outer perimeter of the conductive layer 11 and that, when viewed from above the one main surface of the substrate 1, the light emitting portion 2 is formed so as to enclose the exposed portion 11' of the conductive layer 11. In other words, it is desirable that the conductive layer 11 protrudes as far as the outer side of the light emitting portion 2, and has an exposed portion 11'. Moreover, it is desirable that the first electrode 3 that is formed on top of the light emitting portion 2 is also formed in a ring shape (i.e., in a doughnut shape). Furthermore, it is desirable that the pad electrode 9 that is formed on top of the first electrode 3 is also formed in a ring shape (i.e., a doughnut shape), and that the pad electrode 9 is formed around the outer perimeter of the first electrode 3. Moreover, in FIG. 3, it is also possible to form a concave portion on the inner side of the conductive layer 11 in the restricted area of the exposed area 11' of the conductive layer 11, and to fill this with a material having excellent reflectance that is different from the conductive layer 11.

Figure 4:
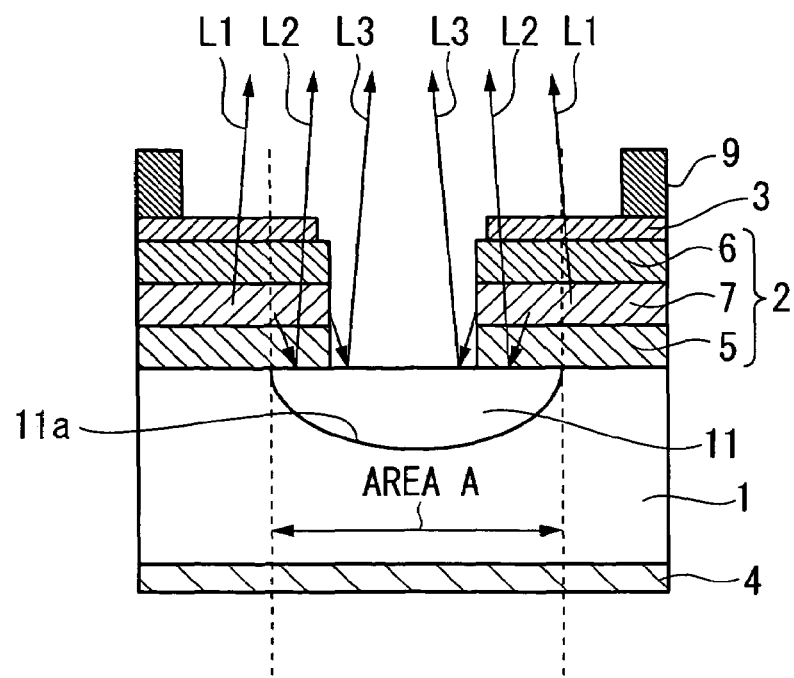
FIG. 4 is a cross-sectional view for illustrating the operation and effect of the semiconductor light emitting diode according to a second embodiment of the present invention.

FIG. 4 is a cross-sectional view for illustrating the operation and effect of the semiconductor light emitting diode according to the second embodiment of the present invention that is shown in FIG. 2. According to the semiconductor light emitting diode of the second embodiment of the present invention, in the same way as for the semiconductor light emitting diode of the first embodiment, it is possible for the light extraction efficiency to be improved. Namely, the light that is emitted from the light emitting portion 2 is not only light L1 that is emitted upwards (i.e., in the direction of the first electrode 3), as viewed from the light emitting portion 2, but also light that is emitted downwards (i.e., in the direction of the second electrode 4). A portion of this light that is emitted downward is reflected by the conductive layer 11 and becomes light L2 that is traveling upward. Light is also emitted from side surfaces on the inner side of the light emitting portion 2. A portion of this light that is emitted from the side surfaces is also reflected by the conductive layer 11 and becomes light L3 that is traveling upward. As a result, it is possible to improve the light extraction efficiency at light extraction surfaces (i.e., upwards) in the semiconductor light emitting diode of the second embodiment of the present invention.

Moreover, according to the semiconductor light emitting diode of the second embodiment, because the conductive layer 11 also functions as a reflective membrane, it is possible to improve the light extraction efficiency by effectively reflecting emitted light in the direction of the light extraction surface while at the same time securely maintaining the current path. Namely, it is possible to improve the light extraction efficiency while keeping the voltage in the forward direction at a low level.

Furthermore, according to the semiconductor light emitting diode of the second embodiment, the conductive layer 11 is not provided directly below the pad electrode 9, but is provided in the area A. In other words, the disposition of the conductive layer 11 is restricted to locations that are comparatively distant from the pad electrode 9. By thus positioning the conductive layer 11, it is possible to reduce the resistance value passing through the conductive layer 11, and it is possible to achieve the same effect as is achieved in a structure in which a high resistance layer (i.e., a current blocking layer) is provided directly below the pad electric 9. Namely, it is possible to reduce the concentration of current directly below the pad electrode 9, improve brightness unevenness, and achieve an extended lifespan.

Third Embodiment

Figure 5:
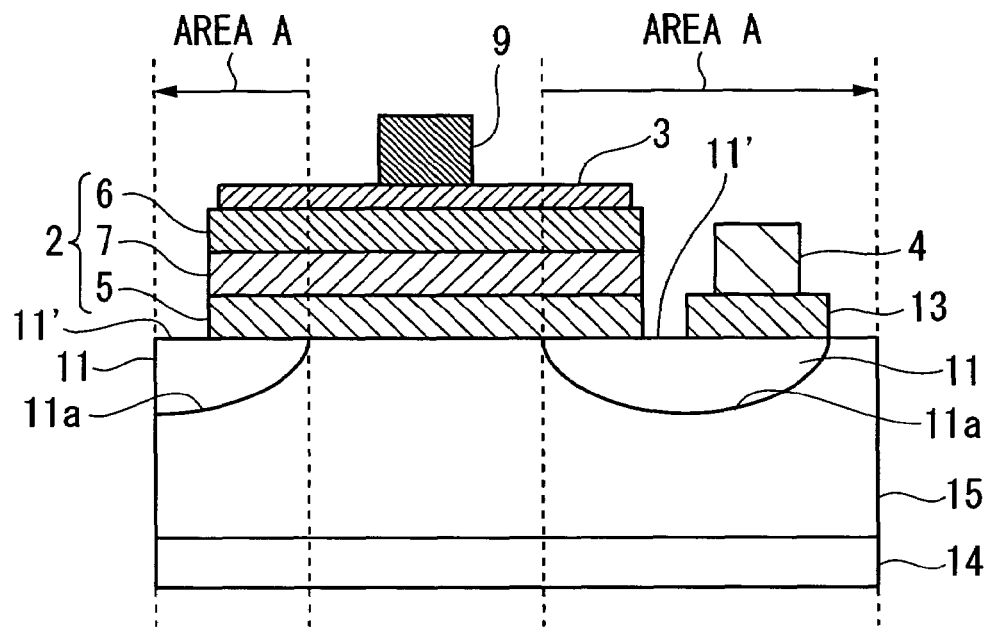
FIG. 5 is a cross-sectional view showing a semiconductor light emitting diode according to a third embodiment of the present invention.

FIG. 5 is a cross-sectional view showing a semiconductor light emitting diode according to a third embodiment of the present invention. In FIG. 5, component elements that are the same as component elements of the first embodiment shown in FIG. 1 are given the same symbols. In the first and second embodiments, a structure is described in which a pair of electrodes are provided on a bottom surface of the substrate 1 and a top surface of the semiconductor light emitting diode area, and current flows in the thickness direction of the diode (i.e., in a vertical direction), however, as is shown in the third embodiment, it is also possible to apply the present invention to a semiconductor light emitting diode that has a structure in which current flows in a horizontal direction. Namely, the present invention can also be applied to a structure in which the first electrode 3 and the second electrode 4 are positioned in parallel above the one main surface. Moreover, in the third embodiment, the substrate 1 of the first embodiment is replaced by a structure in which a semiconductor layer 15 is formed on a non-conductive substrate 14.

Here, it is also possible for a contact layer 13 to be formed between the second electrode 4 and the semiconductor layer 15. Note that the first cladding layer 5 and the contact layer 13 are separated.

It is desirable that the conductive layer 11 is disposed on a concave portion 11a that is formed in a portion of the area of one main surface (i.e., the top surface) of the semiconductor layer 15, and that, when viewed from above the one main surface of the semiconductor layer 15, the conductive layer 11 is formed extending from the inner side of the light emitting portion 2 to an area where the substrate extends beyond the light emitting portion 2. In other words, it is desirable that the conductive layer 11 is formed so as to protrude as far as the outer side of the light emitting portion 2. Furthermore, it is also desirable that the conductive layer 11 protrudes as far as the outer side of the light emitting portion 2 and is also exposed when viewed from above the one main surface. In other words, it is desirable that the conductive layer 11 that is positioned so as to include the inner side of the light emitting portion 2 adjacent to the outer circumference of the light emitting portion 2 and an exposed portion 11' of the conductive layer 11 that is positioned in a ring shape so as to encircle the outer circumference of the light emitting portion 2 are formed so as to be continuous with each. It is also preferable that, when viewed from above the one main surface, the conductive layer 11 reaches as far as the inner side of the contact layer 13 via the exposed portion 11'. However, it is also desirable that, when viewed from the one main surface, the concave portion 11a is positioned in areas that are not directly below the pad electrode 9. Note that, in a semiconductor light emitting diode having a structure in which current flows in a horizontal direction, it is also possible to use a non-conductive substrate made of sapphire or the like instead of a conductive substrate made of silicon or the like. Moreover, when viewed from above the one main surface, the conductive layer 11 is formed directly under the entire bottom surface of the contact layer 13, however, it does not need to include the area directly under the contact layer 13. However, it is desirable that it is formed so as to include a portion of an area next to the semiconductor layer 5. In addition, it is also possible to form a concave portion on the inner side of the conductive layer 11 in the restricted area of the exposed area 11 of the conductive layer 11, and to fill this with a material having excellent reflectance that is different from the conductive layer 11.

Figure 6:
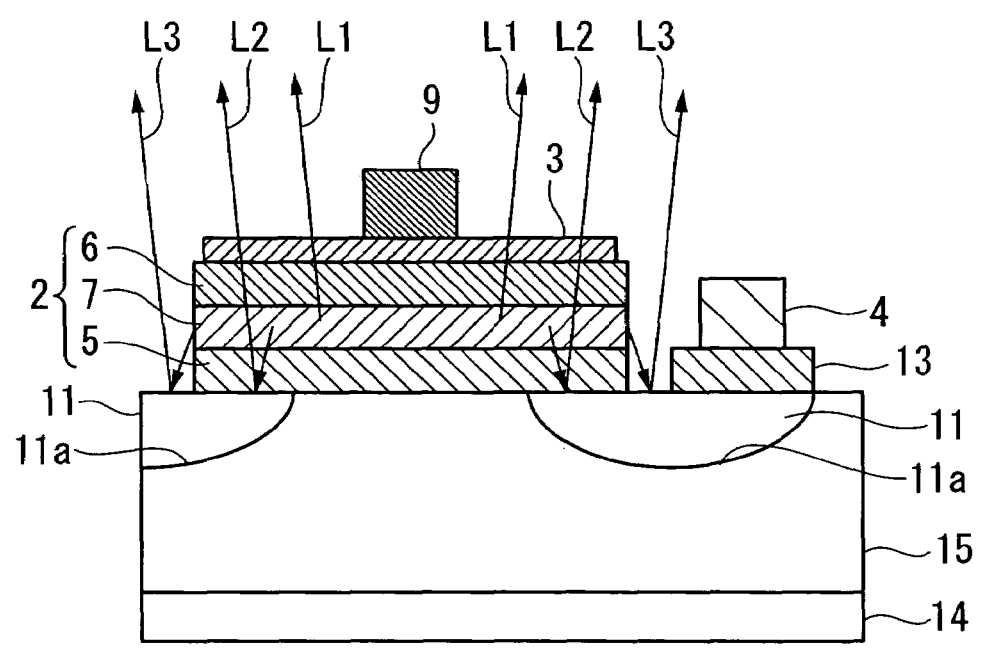
FIG. 6 is a cross-sectional view for illustrating the operation and effect of the semiconductor light emitting diode according to a third embodiment of the present invention.

FIG. 6 is a cross-sectional view for illustrating the operation and effect of the semiconductor light emitting diode according to the third embodiment of the present invention that is shown in FIG. 5. In the semiconductor light emitting diode of the third embodiment, current flows in a horizontal direction inside the semiconductor light emitting layer 15, however, by forming the conductive layer 11 such that is protrudes inside the semiconductor layer 5 as far as the outer side of the light emitting portion 2, in the same way as for the first semiconductor light emitting diode of the first embodiment, it is possible for the light extraction efficiency to be improved. Namely, the light that is emitted from the light emitting portion 2 is not only light L1 that is emitted upwards (i.e., in the direction of the first electrode 3), as viewed from the light emitting portion 2, but also light that is emitted downwards (i.e., in the direction of the second electrode 4). A portion of this light that is emitted downward is reflected by the conductive layer 11 and becomes light L2 that is traveling upward. Light is also emitted from side surfaces of the light emitting portion 2. A portion of this light that is emitted from the side surfaces is also reflected by the conductive layer 11 and becomes light L3 that is traveling upward. As a result, this semiconductor light emitting diode makes it possible to improve the light extraction efficiency at light extraction surfaces (i.e., upwards).

Moreover, according to the semiconductor light emitting diode of the third embodiment, because the conductive layer 11 also functions as a reflective membrane, it is possible to improve the light extraction efficiency by effectively reflecting emitted light in the direction of the light extraction surface while at the same time securely maintaining the current path. Namely, it is possible to improve the light extraction efficiency while keeping the voltage in the forward direction at a low level.

Furthermore, according to the semiconductor light emitting diode of the third embodiment, the conductive layer 11 is not provided directly below the pad electrode 9. In other words, the disposition of the conductive layer 11' is restricted to locations that are comparatively distant from the pad electrode 9. By thus positioning the conductive layer 11, it is possible to reduce the resistance value passing through the conductive layer 11, and it is possible to achieve the same effect as is achieved in a structure in which a high resistance layer (i.e., a current blocking layer) is provided directly below the pad electric 9. Namely, it is possible to reduce the concentration of current directly below the pad electrode 9, improve brightness unevenness, and achieve an extended lifespan.

Fourth Embodiment

Figure 7:
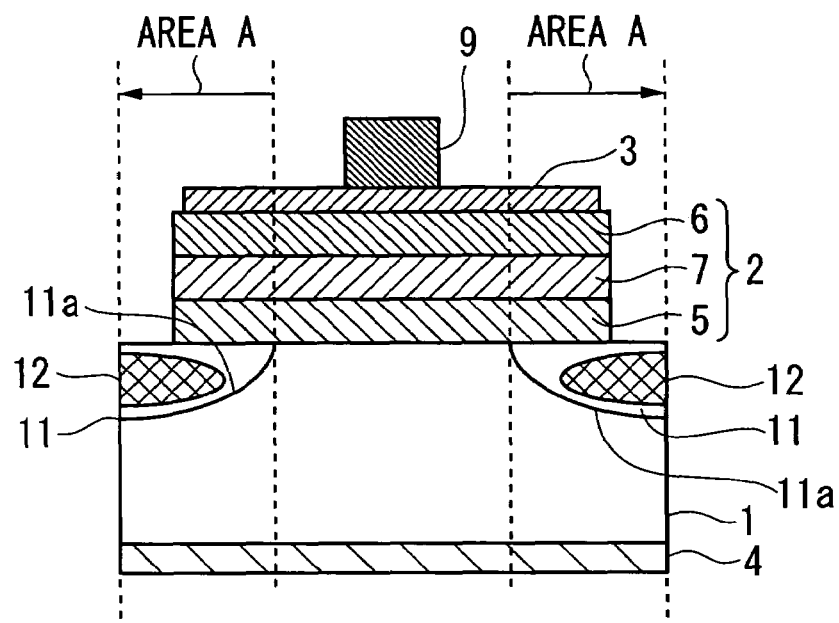
FIG. 7 is a cross-sectional view showing a semiconductor light emitting diode according to a fourth embodiment of the present invention.

FIG. 7 is a cross-sectional view showing a semiconductor light emitting diode according to a fourth embodiment of the present invention. In FIG. 7, component elements that are the same as component elements of the first embodiment shown in FIG. 1 are given the same symbols. The fourth embodiment differs from the first embodiment in that a reflective membrane 12 that is formed from a material having a different refractive index from the refractive index of the conductive layer 11 is provided on the inner side of the conductive layer 11. The fourth embodiment can be applied to the first through third embodiments. The material constituting the reflective membrane 12 is desirably one having a higher refractive index than the conductive layer 11, and may also be a non-conductive material.

Figure 8:
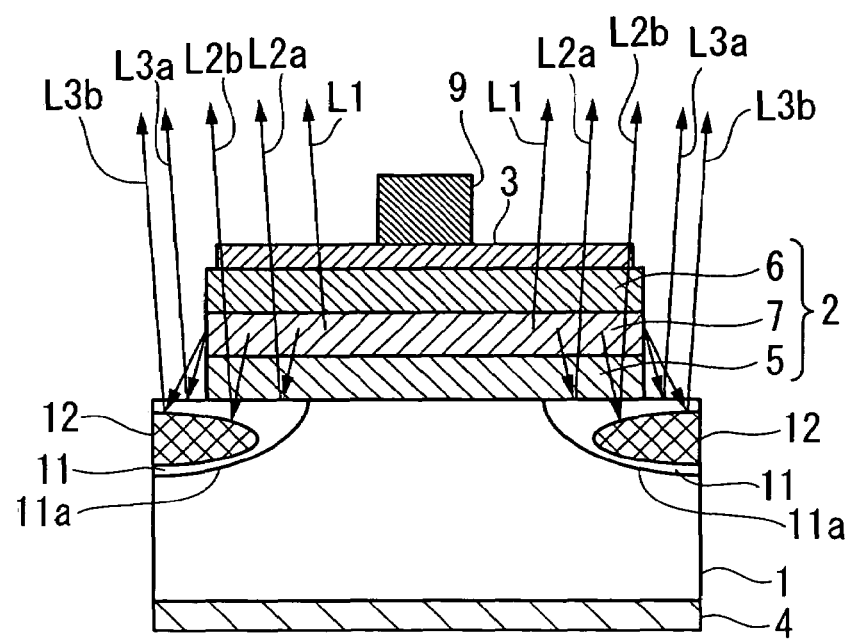
FIG. 8 is a cross-sectional view for illustrating the operation and effect of the semiconductor light emitting diode according to a fourth embodiment of the present invention.

FIG. 8 is a cross-sectional view for illustrating the operation and effect of the semiconductor light emitting diode according to the fourth embodiment that is shown in FIG. 7. According to the semiconductor light emitting diode of the fourth embodiment, it is possible to achieve a more improved light extraction efficiency than in the semiconductor light emitting diode of the first embodiment. Namely, the light that is emitted from the light emitting portion 2 is not only light L1 that is emitted upwards (i.e., in the direction of the first electrode 3), as viewed from the light emitting portion 2, but also light that is emitted downwards (i.e., in the direction of the substrate 1). A portion of this light that is emitted downward is reflected by the conductive layer 11 and becomes light L2a that is traveling upward. Another portion of the light that is emitted downwards is reflected by the reflective membrane 12 and becomes light L2b that is traveling upward. Light is also emitted from side surfaces of the light emitting portion 2. A portion of this light that is emitted from the side surfaces is also reflected by the conductive layer 11 and becomes light L3a that is traveling upward. Another portion of the light that is emitted from the side surfaces is reflected by the reflective membrane 12 and becomes light L3b that is traveling upward. As a result, the semiconductor light emitting diode of the fourth embodiment achieves a more improved light extraction efficiency at light extraction surfaces (i.e., upwards). Moreover, according to the semiconductor light emitting diode of the fourth embodiment, because the conductive layer 11 also functions as a reflective membrane, it is possible to improve the light extraction efficiency by effectively reflecting emitted light in the direction of the light extraction surface while at the same time securely maintaining the current path.

Namely, it is possible to improve the light extraction efficiency while keeping the voltage in the forward direction at a low level.

Moreover, according to the semiconductor light emitting diode of the fourth embodiment, because the conductive layer 11 also functions as a reflective membrane, it is possible to improve the light extraction efficiency by effectively reflecting emitted light in the direction of the light extraction surface while at the same time securely maintaining the current path. Namely, it is possible to improve the light extraction efficiency while keeping the voltage in the forward direction at a low level.

Furthermore, according to the semiconductor light emitting diode of the fourth embodiment, the conductive layer 11 is disposed in the area referred to as area A in the first through third embodiments. In other words, the disposition of the conductive layer 11 is restricted to locations that are comparatively distant from the pad electrode 9. By thus positioning the conductive layer 11, it is possible to reduce the resistance value passing through the conductive layer 11, and it is possible to achieve the same effect as is achieved in a structure in which a high resistance layer (i.e., a current blocking layer) is provided directly below the pad electric 9. Namely, it is possible to reduce the concentration of current directly below the pad electrode 9, improve brightness unevenness, and achieve an extended lifespan.

(Manufacturing Method)

FIG. 9A to FIG. 9F are cross-sectional views showing an example of a method of manufacturing a semiconductor light emitting diode according to an embodiment of the present invention. FIG. 9A to FIG. 9F use the semiconductor light emitting diode of the first embodiment that is shown in FIG. 1 as an example. Note that component elements in FIG. 9A to FIG. 9F that are the same as those shown in FIG. 1 are given the same symbols.

Firstly, the substrate 1 is prepared. The first cladding layer 5, the light emitting layer 7, and the second cladding layer 6 are then stacked in this sequence on the substrate 12 using a metalorganic vapor phase epitaxy (MOVPE) method. As a result, the light emitting portion 2 is formed on the substrate 1. A transparent electrode is then formed on the entire surface of the second cladding layer 6, and this transparent electrode forms the first electrode 3 (see FIG. 9A).

Next, a photomask is formed selectively on a surface (i.e., the surface on the first electrode 3 side) of the substrate 1. Dry etching is then performed. In this dry etching, using the difference between the etching speeds of the substrate 1 and the light emitting portion 2, as is shown in FIG. 9B, portions of the first electrode 3 and the light emitting portion 2 are selectively removed so as to form grooves 21. Portions of the top surface of the substrate 1 are exposed by these grooves.

Next, using, for example, an etching solution made up of a liquid mixture of HF and HNO$_3$, isotropic etching is performed only on the exposed portions of the substrate 1. As a result, concave portions 11a are formed on one main surface of the substrate 1 so as to extend from the exposed portions of the substrate 1 in the direction of boundary faces between the substrate 1 and the light emitting portion 2. In other words, the substrate 1 is etched taking the grooves 21 as a starting point, and the concave portions 11a are formed on one main surface of the substrate 1. As is shown in FIG. 9C, these concave portions 11a are formed having overhangs made up of the light emitting portions 2.

Next, at least a conductive material is embedded in the concave portions 11a using a plating method, a chemical vapor deposition (CVD) method, a sol-gel method or the like.

As a result, as is shown in FIG. 9D, the conductive layer 11 that has a reflecting function is formed in the concave portions 11a.

Next, as is shown in FIG. 9E, the second electrode 4 is formed on the entire bottom surface of the substrate 1, and pad electrodes 9 are formed on the first electrode 3. Next, as is shown in FIG. 9F, dicing is performed in the direction of the arrows 23. As a result, a number of the semiconductor light emitting diodes shown in FIG. 1 are completed. Note that the semiconductor light emitting diodes according to the second through fourth embodiments can also be manufactured using the above described manufacturing method.

As a result of the above, according to the manufacturing method of the present embodiment, it is possible to simplify the selection of a material to form the conductive layer 11. Namely, after the light emitting portion 2 is formed on the substrate 1, the concave portions 11a can be formed using isotropic etching or the like, and the conductive layers 11 can be formed in the concave portions 11. Accordingly, compared to a method in which bonding is performed, which is the conventional manufacturing method, the manufacturing method of the present embodiment presents no problems regarding adhesion between the conductive layer 11 and the substrate 1 and light emitting portion 2. Moreover, because there is no step of stacking the light emitting portion 2 on the conductive layer 11, it is difficult for crystal growth to occur on the light emitting portion 2, and it is possible to reduce crystal defects.

Furthermore, according to the manufacturing method of the present embodiment, because there is no step to adhere the substrate 1 and the light emitting portion 2 together, it is possible to easily manufacture the semiconductor light emitting diodes of the first through fourth embodiments. Consequently, according to this manufacturing method, it is possible to manufacture at low cost semiconductor light emitting diodes that have a comparatively high light extraction efficiency, and a comparatively low voltage in the forward direction.

Embodiments of the present invention are described above, however, the semiconductor light emitting diode and the semiconductor light emitting diode manufacturing method of the present invention are not limited only to those in the above described examples, and various modifications thereof are possible insofar as they do not depart from the spirit or scope of the present invention.

The present invention is effective for a variety of semiconductor light emitting diodes. Namely, the present invention can be applied to a variety of light emitting diodes. For example, the present invention can be applied to gallium nitride based compound blue light emitting diodes.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as limited by the foregoing description and is only limited by the scope of the appended claims.

What is claimed is:

1. A semiconductor light emitting diode comprising:
   a substrate;
   a light emitting portion that is disposed on one main surface of the substrate;
   a first electrode that is disposed on the light emitting portion;
   a pad electrode that is disposed on the first electrode; and a conductive layer that is formed from a conductive material and reflects light emitted from the light emitting portion, wherein, the one main surface of the substrate includes an area that extends beyond the light emitting portion, and wherein the conductive layer is formed on the side of the one main surface of the substrate and includes a portion that is beneath the light emitting portion and extends towards the area where the substrate extends beyond the light emitting portion, and the conductive layer is not formed directly beneath the pad electrode.

2. The semiconductor light emitting diode according to claim 1, wherein the conductive layer has a function of connecting the substrate to the light emitting portion and is in contact with the substrate and the light emitting portion, the substrate has an area in contact with the light emitting portion, and a sum of a contact resistance between the conductive layer and the substrate and a contact resistance between the conductive layer and the light emitting portion is less than a contact resistance between the light emitting portion and the substrate.

3. The semiconductor light emitting diode according to claim 1, wherein the conductive layer further includes an exposed portion that is not beneath the light emitting portion.

4. The semiconductor light emitting diode according to claim 1, wherein a reflective membrane is formed from a material having a different refractive index from the refractive index of the conductive layer is disposed in an interior of the conductive layer.

5. The semiconductor light emitting diode according to claim 1, wherein the light emitting portion is formed in a ring shape such that the substrate has an area that extends beyond the light emitting portion.

6. The semiconductor light emitting diode according to claim 5, wherein the conductive layer is formed on a concave portion that is formed on the substrate, and the conductive layer includes an exposed portion enclosed by the light emitting portion.

7. The semiconductor light emitting diode according to claim 6, wherein the first electrode and the pad electrode are formed in ring shapes, and the pad electrode is formed around the perimeter of the first electrode.

* * * * *